(12) United States Patent
Williams

(10) Patent No.: US 6,353,403 B1
(45) Date of Patent: Mar. 5, 2002

(54) FAST RAMPING OF CONTROL VOLTAGE WITH ENHANCED RESOLUTION

(75) Inventor: Rodney Owen Williams, Cary, NC (US)

(73) Assignee: Ericsson Inc.

(*) Notice: Subject to any disclaimer, the term of this patent is extended or adjusted under 35 U.S.C. 154(b) by 0 days.

(21) Appl. No.: 09/544,583

(22) Filed: Apr. 6, 2000

(51) Int. Cl.[7] ............................................. H03M 1/66
(52) U.S. Cl. ...................................................... 341/144
(58) Field of Search ................................ 341/144, 145, 341/152; 324/73.1; 327/276

(56) References Cited

U.S. PATENT DOCUMENTS

| 4,094,480 A | 6/1978 | Nixon | |
|---|---|---|---|
| 5,355,098 A | 10/1994 | Iwasaki | |
| 5,621,485 A | 4/1997 | Terao et al. | |
| 6,121,811 A | * 9/2000 | Scott | 327/276 |
| 6,232,759 B1 | * 5/2001 | Wohlfarth | 324/73.1 |

FOREIGN PATENT DOCUMENTS

| GB | 2317279 A | 3/1998 |
|---|---|---|
| JP | 0579978 A1 | 1/1994 |

* cited by examiner

*Primary Examiner*—Brian Young
(74) *Attorney, Agent, or Firm*—Coats & Bennett, P.L.L.C.

(57) ABSTRACT

A logic circuit for generating a control voltage includes a ramp DAC and a main DAC. When the control voltage is needed, such as when an associated crystal oscillator is being "turned on," an input reference voltage is supplied to both the ramp DAC and the main DAC. The ramp DAC generates an output based on the input reference voltage and L supplied control bits for a (preferably short) ramp time period. The output from the ramp DAC is fed to a filter circuit that includes a capacitor to charge the capacitor and the control voltage is generated at least in part from the ramp DAC output as filtered by the capacitor. When the ramp period ends, the state of the input reference voltage is changed and the output from the main DAC, based on the changed input reference voltage and N control bits, is input to the filter. Such a two DAC arrangement allows for a shorter time constant circuit to be employed in association with the ramp DAC and a longer time constant circuit to be employed in association with the main DAC, allowing for quick ramp up of the control voltage.

22 Claims, 2 Drawing Sheets

FAST RAMPING OF CONTROL VOLTAGE WITH ENHANCED RESOLUTION

BACKGROUND OF THE INVENTION

The present invention relates to a method and apparatus for quickly ramping up a control voltage supplied to a voltage controlled device, such as voltage controlled crystal oscillator.

For wireless communications mobile terminals, such as cellular telephones, minimizing power usage so as to conserve battery power is a major design consideration. One typical consumer of battery power in such devices is the device's frequency synthesizer, which typically includes a crystal oscillator. The crystal oscillator generates a controlled reference frequency that is used to generate the desired mixing and other frequencies used for various wireless communications tasks. As known in the art, this crystal oscillator typically takes the form of a voltage controlled crystal oscillator. However, most mobile terminals typically communicate on a time division multiplex basis, meaning that there are significant periods of idleness when the crystal oscillator is not needed. For instance, a mobile terminal may be in what is known as an idle state when the mobile terminal is camped on a control channel, but otherwise not engaged in a call. In such situations, the mobile terminal may only need the crystal oscillator to check paging messages, which may, for example, occur once every 1.28 seconds. Thus, in order to conserve battery power, it may be prudent to turn off the crystal oscillator of a wireless communications mobile terminal when the crystal oscillator is not needed for communications or other tasks. Obviously, when the crystal oscillator is turned back on, it is desirable to bring the crystal oscillator to the proper frequency as quickly as possible so as to reduce the amount of time the crystal oscillator has to be powered on.

In most mobile terminals, a 10-bit digital to analog converter (DAC) is used to tune the crystal oscillator to the proper frequency. The 10-bit DAC is typically connected to the crystal oscillator via a filter network for filtering the control output from the DAC. Typically, the filtering network provides a long time constant for smoothing frequency corrections. One drawback of a filter network with long time constant is that the filtered control output settles very slowly. Thus, the control voltage seen by the crystal oscillator is slow to ramp up and the crystal oscillator is therefore slow to achieve the proper frequency. Thus, the crystal oscillator must be "turned on" sooner so that it may be at the proper frequency when needed.

Thus, there remains a need for a method and apparatus for generating a control voltage that generally retains the advantage of a long time constant but that also allows for quick ramp up.

SUMMARY OF THE INVENTION

A logic circuit for generating a control voltage according to a first aspect of the present invention includes two DACs, frequently referred to herein as the ramp DAC and the main DAC. When the control voltage is needed, such as when the crystal oscillator is being "turned on," an input reference voltage is supplied to at least the ramp DAC, and preferably to both the ramp DAC and the main DAC. The ramp DAC generates an output based on the input reference voltage and L supplied control bits for a first (preferably short) time period. In most embodiments, this output from the ramp DAC is fed to a filter circuit that includes a capacitor. The output from the ramp DAC charges the capacitor and the control voltage is generated at least in part from the ramp DAC output as filtered by the capacitor. When the first time period ends, the state of the input reference voltage is changed and the output from the main DAC, based on the changed input reference voltage and N control bits, is input to the filter. Thus, after the first time period expires, the control voltage is preferably based on the output from the main DAC.

One purpose of the ramp DAC is to supply an output that causes a more accelerated charging of the capacitor in the filter as compared with the output of the main DAC. Such a two DAC arrangement allows for a shorter time constant circuit to be employed in association with the ramp DAC and a longer time constant circuit to be employed in association with the main DAC, allowing for quick ramp up of the control voltage.

For the present invention, the number of control bits for the ramp DAC (L) is less than the number of control bits for the main DAC (N). However, as noted, the state of the input reference voltage is changed when the first time period (e.g., the ramp period) expires. This approach is taken so that the output of the ramp DAC may be more closely matched to the output of the main DAC. By adjusting the input reference voltage when supplied to the ramp DAC during the ramp period, as compared with when supplied to the main DAC after the ramp period, the circuit allows emulation of greater than L-bit control for the ramp DAC. Thus, the output of the ramp DAC may be more closely "tuned" to the output of the main DAC without increasing the number of control bits supplied to the ramp DAC.

DETAILED DESCRIPTION OF THE PREFERRED EMBODIMENT(S)

Embodiment(s) of the present invention will be described in the context of a wireless communications mobile terminal, such as cellular telephones, pagers, personal digital assistants, and the like. However, it is to be understood that the present invention is not limited to mobile terminals, but may be used in a variety of devices.

Mobile terminals typically include a crystal oscillator 10 for providing a known reference frequency that is used for a variety of purposes well known in the art. Because the crystal oscillator 10 draws power when in use, and because mobile terminals are typically battery powered, it is desirable to minimize the amount of time that the crystal oscillator 10 is powered on. As such, it is common to depower the crystal oscillator 10 in a sleep mode and to "awaken" the crystal oscillator 10 when needed, typically on a periodic basis. To "wake" the crystal oscillator 10, a control voltage is provided to the crystal oscillator 10. As is well understood in the art, the quicker the control voltage assumes the proper value, the quicker the crystal oscillator 10 assumes the proper frequency. The present invention provides a method of supplying a control voltage that quickly assumes the proper value to the crystal oscillator 10.

Figure 1:
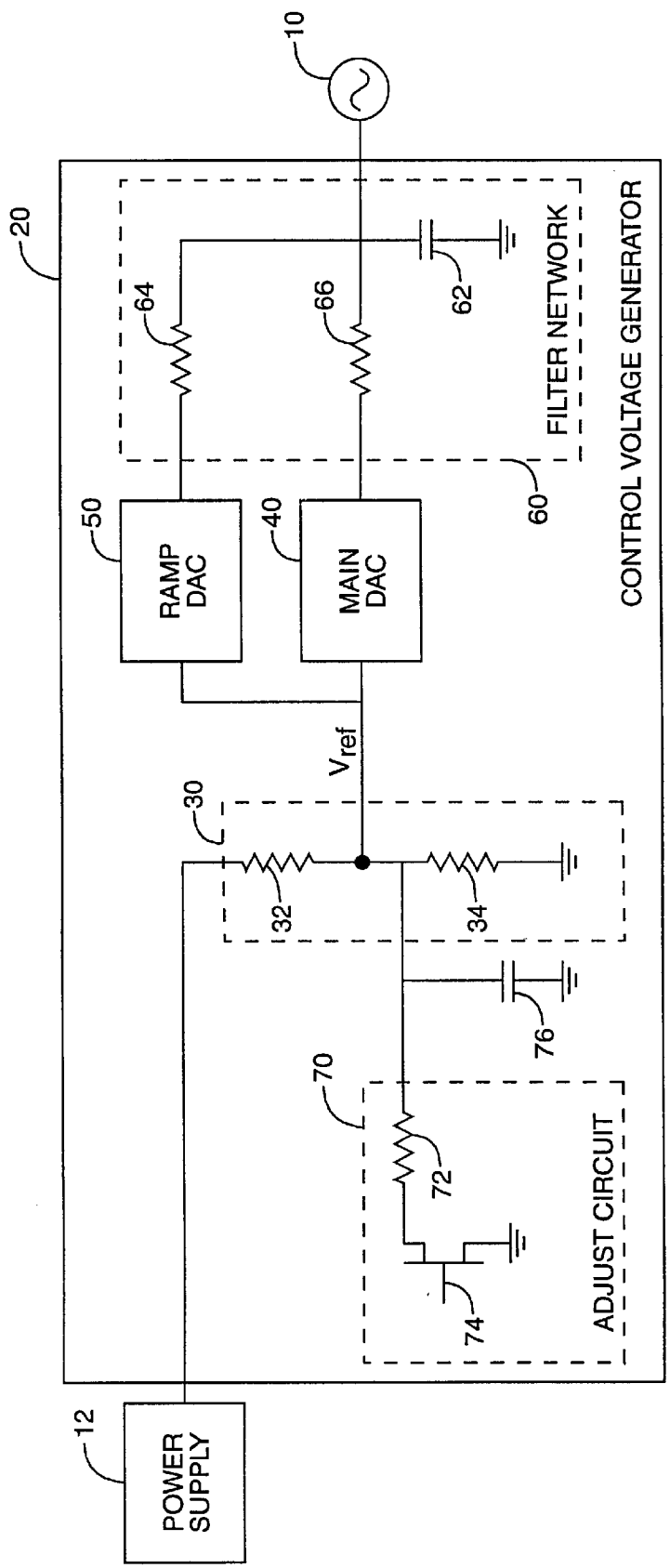
FIG. 1 is a schematic of one embodiment of a control voltage generator according to the present invention.

As shown in FIG. 1, the crystal oscillator 10, typically a voltage controlled crystal oscillator (VCXO), is supplied a control voltage from a control voltage generator 20. The control voltage generator 20 includes a reference voltage source 30, a main digital to analog converter (DAC) 40, a ramp DAC 50, a filter network 60, and a reference voltage adjustment circuit 70. The control voltage generator 20 receives power from the power supply 12, either directly or indirectly. Typically, this power is a regulated voltage. For purpose of illustration, the reference voltage source 30 may be thought of as a voltage divider network including a primary resistor 32 and a secondary resistor 34 connected in series. The reference voltage is pulled from a tap connected between the two resistors 32,34. The reference voltage is in turn supplied to both the main DAC 40 and the ramp DAC 50, which are connected in parallel between the reference voltage source 30 and the filter network 60. Typically the main DAC 40 is a 10-bit DAC, meaning that the output voltage of the main DAC 40 is dependent on the contents of a 10-bit control word supplied to the main DAC 40. The ten bits of the control word define which of a plurality of voltage levels, typically between some upper and lower limits related to the reference voltage supplied to the main DAC 40, will be output by the main DAC 40. Thus, the output of the main DAC 40 is a function of the 10-bit control word and the reference voltage. Preferably, the main DAC 40 is able to source on the order of 1 mA of current. Typically, the ramp DAC 50 is an 8-bit DAC. That is, the output of the ramp DAC 50 is one of plurality of voltage levels defined by the 8-bit control word and the reference voltage supplied to the ramp DAC 50. Preferably, the ramp DAC 50 is capable of supplying significantly more current than the main DAC 40, such as by a factor of ten or more.

The outputs of the DACs 40,50 are routed through the filter network 60. The filter network 60 takes those outputs, and smoothes the same, to produce a control signal that is provided to the crystal oscillator 10. The filter network 60 of FIG. 1 includes a capacitor 62, a main resistor 66, and a ramp resistor 64. The main resistor 66 is connected between the capacitor 62 and the main DAC 40, while the ramp resistor 64 is connected between the capacitor 62 and the ramp DAC 50.

Connected to the reference voltage source 30 is a reference voltage adjustment circuit 70. The reference voltage adjustment circuit 70 functions to selectively adjust the reference voltage supplied by the reference voltage source 30. In the embodiment shown in FIG. 1, the reference voltage adjustment circuit 70 includes an adjustment resistor 72 and a transistor 74. The adjustment resistor 72 is connected between the reference voltage source 30 and the transistor 74. The transistor 74 is connected between the adjustment resistor 72 and ground. For the arrangement of the reference voltage adjustment circuit 70 shown in FIG. 1, the transistor 74 is configured as an open drain output. Thus, when transistor 74 is off, no current flows through adjustment resistor 72 and the reference voltage is determined by the voltage divider ratio of resistors 32 and 34. When transistor 74 is turned on, however, current flowing through primary resistor 32 splits between adjustment resistor 72 and secondary resistor 34, thereby altering the voltage divider ratio of the reference voltage source 30. The net effect of bringing the adjustment resistor 72 into play is to pull down the reference voltage by a predetermined amount. Thus, the reference voltage may be thought of as having two states—a high state when the transistor 74 of the reference voltage adjustment circuit 70 is not on and a low state when the transistor 74 is on. A optional capacitor 76 or equivalent may be included between the reference voltage adjustment circuit 70 and the reference voltage source 30 to reduce noise on the reference voltage from the power supply 12.

It should be noted that discussion above has assumed one configuration for the reference voltage adjustment circuit 70, where the reference voltage adjustment circuit 70 acts to pull down the reference voltage, for clarity. However, the reference voltage adjustment circuit 70 may take any number of configurations, including configurations where the reference voltage adjustment circuit 70 acts to pull up the reference voltage. For instance, the adjustment resistor 72 may be connected to the reference voltage source 30 "above" the tap for the reference voltage and the transistor 74 may be connected to a voltage source (rather than ground).

When the crystal oscillator 10 is not needed, the control voltage generator 20 may be put in a sleep state. In a sleep state, the main DAC 40 and the ramp DAC 50 are preferably unpowered, but at least produce no output. Preferably, the ramp DAC 50 and the main DAC 40 provide a substantial output resistance, such as 300 kΩ, when disabled/depowered. In the sleep state, the charge in capacitor 62 dissipates and the capacitor 62 is typically substantially discharged at the end of the sleep state. Accordingly, the control voltage being supplied to the crystal oscillator 10 is essentially zero during the sleep state. Preferably, the crystal oscillator 10 is designed to use no power when the control voltage is zero. It should be noted that even though the control voltage generator 20 and the crystal oscillator 10 may be asleep, other portions of the mobile terminal typically remain active.

When it is anticipated that the crystal oscillator 10 will be needed, the control voltage generator 20 is awakened. If not done continuously, power is supplied to the reference voltage source 30. In addition, the ramp DAC 50 is enabled, and an output from the ramp DAC 50 is supplied to the filter circuit of the ramp resistor 64 and the capacitor 62. This output of the ramp DAC 50 causes the capacitor 62 to start charging. The time constant of the charging is determined by the capacitance and resistance values of the capacitor 62 and the ramp resistor 64 and the current sourcing capability of the ramp DAC 50. Preferably, this time constant is very small. After filtering by the filter network 60, the voltage from the ramp DAC 50 is applied to the crystal oscillator 10 and the crystal oscillator 10 begins to tune to the desired frequency.

After a predetermined minimum amount of time, the ramp DAC 50 is disabled and the main DAC 40 is enabled. When this is done, the capacitor 62 is preferably substantially charged, such as ninety-nine percent or more of full charge. As discussed above, the output of the main DAC 40 flows through the filter circuit of the main resistor 66 and the capacitor 62. Even though the filter circuit of the ramp DAC 50 (i.e., the ramp resistor 64 plus the capacitor 62) and the filter circuit of the main DAC 40 (i.e., the main resistor 66 plus the capacitor 62) share the same capacitor 62, the resistance values of the resistors 64,66 are preferably chosen so that the filter circuit of the ramp DAC 50 has a time constant much smaller than the time constant of the filter circuit of the main DAC 40, such as by a factor of ten or more. After ramping up the initial control voltage with ramp DAC 50, control of the crystal oscillator 10 is maintained by the more precise voltage output from the main DAC 40 and the ramp DAC 50 is preferably disabled. The operation of the crystal oscillator 10 is then based on the control voltage supplied by the main DAC 40 and used in a conventional fashion. Thereafter, when the crystal oscillator 10 is again not needed, the sleep condition is again induced and the cycle repeats as needed.

Figure 2:
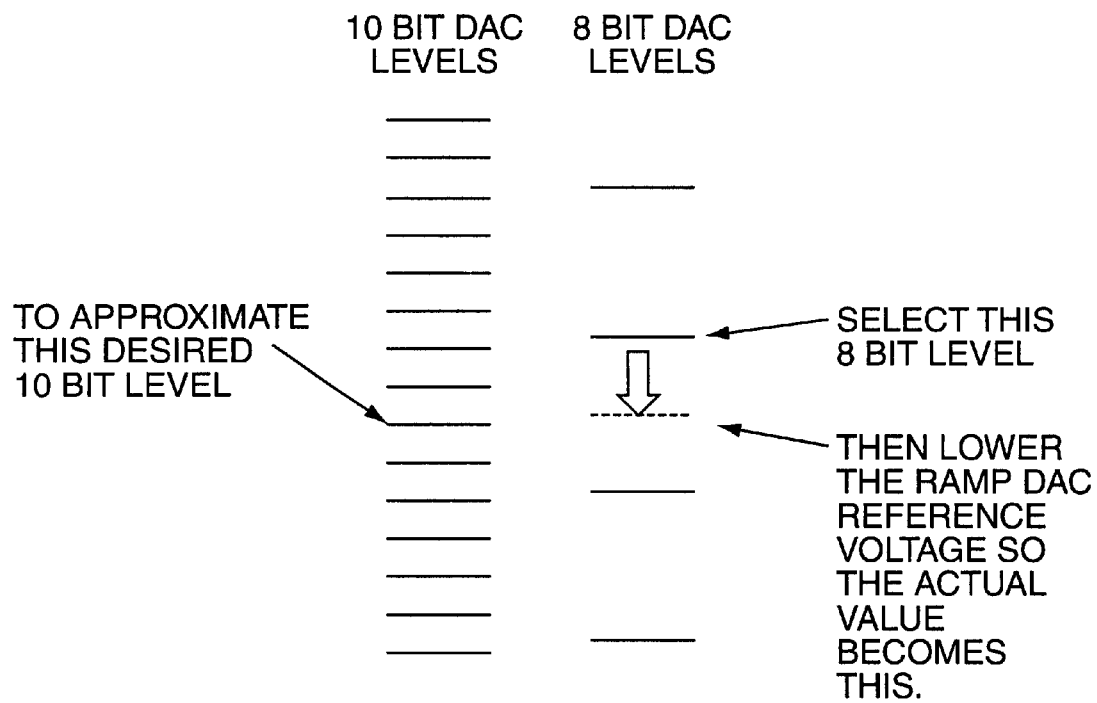
FIG. 2 is a side-by side comparison of the various voltage levels available to the main DAC and the ramp DAC for the embodiment of FIG. 1.

Assuming the ramp DAC 50 is an 8-bit DAC, the output voltage of the ramp DAC 50 can be any one of 256 ($2^L$, where L=8, or $2^8$) voltage levels defined by the 8-bit control word and the reference voltage supplied to the ramp DAC 50. In contrast, the output voltage of the main DAC 40 can be any one of 1024 ($2^N$, where N=10, or $2^{10}$) voltage levels defined by the 10-bit control word and the reference voltage supplied to the main DAC 40. Assuming the same or similar minimum and maximum values, the output voltage of main DAC 40 plainly has finer gradations than the ramp DAC 50. Because the objective of using the ramp DAC 50 is to get the voltage level of the control voltage to the correct value as soon as possible, by quickly charging the capacitor 62, it is advantageous if the voltage level output by the ramp DAC 50 can be as close as possible to the voltage level of the main DAC 40. In the simplest arrangement, the first eight bits of the 10-bit word correspond to the 256 voltage levels of the 8-bit word, while the ninth and tenth bits are used to further divide those 256 levels to result in 1024 levels. In such an arrangement, the voltage levels of the two DACs may match in some instances, but, roughly speaking, will be different 75% of the time. See FIG. 2. As shown in FIG. 2, the 8-bit levels and every fourth level of the 10-bit levels may not match exactly. This is because of potential inherent differences between the ramp DAC 50 and the main DAC 40. However, as shown in FIG. 2, there should be a readily identifiable 10-bit level that corresponds with each 8-bit level; for purposes herein, such levels "match."

In order to have the output voltage level of the ramp DAC 50 more closely match the output voltage level of the main DAC 40, preferred embodiments of the present invention selectively adjust the reference voltage supplied by the reference voltage source 30 during the time period that the ramp DAC 50 is in use. For instance, the reference voltage adjustment circuit 70 is used to temporarily pull down the reference voltage by turning on the transistor 74 to create a path to ground via resistor 72. As will be recognized, pulling down the reference voltage supplied to the ramp DAC 50 has the effect of pulling down the voltage level output by the ramp DAC 50. Assuming the output voltage of the ramp DAC 50 is near the middle of the corresponding range, the adjustment of the reference voltage preferably has the effect of moving the voltage level of the ramp DAC 50 downward by approximately a half-step. Because the turning on or off of the transistor 74 affects a less than one full step adjustment of the output of ramp DAC 50, the adjustment of the reference voltage level provides the ability to emulate 9-bit control of an 8-bit DAC. It should be noted that this >8-bit emulation may actually be accomplished by a single bit supplied to the reference voltage adjustment circuit 70; or, alternatively, the emulation may be accomplished by more than one bit as described further below.

In practice, transistor 74 is selectively turned on when the desired voltage level of the main DAC 40 falls between the defined 8-bit levels of the ramp DAC 50. For instance, if the desired level of the main DAC 40 matches (or is very close to) an available level of the ramp DAC 50, the transistor 74 is not used and the control voltage generator 20 functions to quickly ramp the control voltage as described above without adjusting the reference voltage level. On the other hand, when the desired level of the main DAC 40 falls between levels available to the ramp DAC 50, the next higher level of the ramp DAC 50 is selected via the appropriate 8-bit word and the transistor 74 is turned on to pull down the reference voltage while the reference voltage is supplied to the ramp DAC 50. When it is time to change over to the main DAC 40 following the voltage ramping period, the transistor 74 is turned off, returning the reference voltage to the "normal" level, the ramp DAC 50 is turned off, and the main DAC 40 is turned on. These three actions preferably occur essentially simultaneously, but this is not required and the particular sequence of events is not critical. Indeed, the main DAC 40 may be turned on when the ramp DAC 50 is turned on (working off the selectively adjusted reference voltage); due to the characteristics of the circuit, the effects of the ramp DAC 50 will predominate during ramp up. However, the reference voltage should be returned to "normal" as near as possible in time to the turning off of the ramp DAC 50. As can be seen, the available output levels of the ramp DAC 50 may be increased in number by judiciously adjusting the reference voltage, thereby allowing better matching between the output levels of the ramp DAC 50 and the main DAC 40.

It should be noted that the emulation of greater than 8-bit control of the ramp DAC 50 is not true 9-bit control of the ramp DAC 50. Rather, the effect of the ninth bit, the one controlling the operation of the reference voltage adjustment circuit 70, is actually a scaled effect depending on the "normal" 8-bits. That is, when the 8-bits have a low value, such as "00000100", the effect of the ninth bit is much less than a half-step. Conversely, when the 8-bits have a high value, such as "11010000", the effect of the ninth bit is more than a half-step. Thus, the emulation results in performance that is different from true 9-bit control, but this difference is fairly small near the midpoint of the 8-bit control range (e.g., when the 8-bit word is "10000000").

The nine bits for controlling the ramp DAC 50 and the reference voltage adjustment circuit 70 and the ten bits for controlling the main DAC 40 are preferably supplied by some component external to the control voltage generator 20, such as the mobile terminal's main processor. The mobile terminal's processor may have associated therewith a ramp-up timer. When the crystal oscillator 10 is expected to be needed, the processor enables the ramp DAC 50 (and optionally the main DAC 40). The processor also resets the ramp-up timer, selects and sends the 8-bit control word to the ramp DAC 50, and toggles the reference voltage adjustment circuit 70 as necessary. When the ramp-up timer expires, the processor returns the reference voltage adjustment circuit 70 to normal settings (if necessary), and sends the 10-bit control word to the main DAC 40 (if not already done). The processor may also disable the ramp DAC 50 to effectively shut down the ramp DAC 50. When the crystal oscillator 10 is no longer needed, the processor preferably disables both DACs 40,50 to conserve power. It should be noted that, because the values of the resistors 64,66 and the capacitor 62 are known a priori, the ramp-up timer may be preprogrammed based on the expected time constants involved. In addition, the processor may be preprogrammed with a suitable mapping function used to determine the appropriate 8-bit control word for the ramp DAC 50 corresponding to each 10-bit for the main DAC 40 that may be used, based on empirical or theoretical data concerning the performance of the DACs 40,50.

In one embodiment, the reference voltage source 30 includes a 300 kΩ primary resistor 32 between the tap and the incoming voltage from the power supply 12. The secondary resistor 34 between the tap and ground is 200 kΩ. The reference voltage adjustment circuit 70 includes a FET transistor 74, a 20 MΩ resistor 72 and a 10 nf capacitor 76. The control voltage generator 20 includes an 8-bit ramp DAC 50, a 10-bit main DAC 40, a 100Ω ramp resistor 64, a 30 kΩ main resistor 66, and a 1 µf capacitor 62. With this configuration, the time constant of the RC network for the main DAC 40 is in the neighborhood of 30 ms, while the time constant of the RC network for the ramp DAC 50 is in the neighborhood of 100 µs, and the common voltage reference with the decoupling of the reference voltage adjustment circuit 70 (including the optional capacitor 76) has a time constant in the neighborhood of 2 ms. The output of the control voltage generator 20 is connected to a VCXO 10 of a type well known in the art, such as a tuned oscillator that has a resonant frequency that is adjusted by capacitance of a varactor, where the varactor capacitance is a function of voltage.

From a design standpoint, it should be noted that the larger the value of capacitor 62, the slower the speed of the charging of the capacitor 62 by the ramp DAC 50. Also, if the value of the main resistor 66 is too large, then the control voltage (or "tuning voltage") of the main DAC 40 may be reduced due to loading of the ramp DAC 50 via some feedback through the ramp resistor 64 and the output port of ramp DAC 50 (when disabled).

In the embodiment of FIG. 1, the reference voltage adjustment circuit 70 contains only one resistor 72 selectively engaged via a transistor 74. In other embodiments, the reference voltage adjustment circuit 70 may include a plurality of resistors 72, each controlled by a corresponding transistor 74. With such multi-resistor arrangements, one resistor may be used for adjustment in higher ranges, another in middle ranges, and a third (or both of the previous) in lower ranges. Such an arrangement may help control the scaling effect of the >8-bit control emulation of the ramp DAC 50, but at the cost of requiring additional control bits.

The disclosure above has discussed the invention in terms of a reference voltage source 30 and the reference voltage adjustment circuit 70 in the general form of variable voltage divider network; however, such is not required. Indeed, a wide variety of circuits, well known in the art, may be used to selectively vary the reference voltage supplied to the DACs 40,50. Because the function of these circuits 30,70 is to supply a reference voltage that can be changed between at least two states, any circuit known in the art for accomplishing this task may be used. By way of example, aside from a discrete transistor, an analog switch or a comparator output could be used.

The discussion above has discussed the invention in terms of supplying a control voltage, also known as a tuning voltage, to a crystal oscillator 10. However, the present invention is not so limited, but may be used to quickly ramp up a control voltage for any voltage controlled device, not just a voltage controlled crystal oscillator 10. For instance, this approach is well suited to any application requiring fast attack and accurate high resolution control such as a signal tracking amplifier or a dynamic antenna or laser pointing system.

The present invention may, of course, be carried out in other specific ways than those herein set forth without departing from the spirit and essential characteristics of the invention. For instance, the ramp DAC 50 does not need to have 8-bit control with >8-bit control emulation, but may instead have 9-bit control with >9-bit control emulation, or 6-bit control with >6-bit control emulation, etc. The present embodiments are, therefore, to be considered in all respects as illustrative and not restrictive, and all changes coming within the meaning and equivalency range of the appended claims are intended to be embraced therein.

What is claimed is:

1. A method of generating a control voltage from a logic circuit having a first digital to analog converter having L bit control and a second digital to analog converter having N bit control, wherein L is less than N, said method comprising the steps of:

generating a control voltage signal based on output from said first digital to analog converter for a first time period; said output from said first digital to analog converter based on an input voltage reference signal having a first state; and changing the state of said input voltage reference signal from said first state to a second state and generating said control voltage signal based on output from said second digital to analog converter; said output from said second digital to analog converter based on said input voltage reference signal in said second state.

2. The method of claim 1 further comprising the steps of:

routing said output from said first digital to analog converter to a filter having a capacitor to charge said capacitor;

routing said output from said second digital to analog converter to said filter to charge said capacitor;

wherein said output from said first digital to analog converter accelerates the charging of said capacitor with respect to the output of said second digital to analog converter.

3. The method of claim 2 wherein said output from said first digital to analog converter accelerates the charging of said capacitor with respect to the output of said second digital to analog converter by a factor of 10.

4. The method of claim 2 further comprising, prior to said step of generating a control voltage signal based on output from said first digital to analog converter for a first time period, sleeping said first digital to analog converter and said second digital to analog converter and substantially discharging said capacitor.

5. The method of claim 1 wherein N equals ten and L equals eight.

6. The method of claim 1 wherein:

said step of generating a control voltage signal based on output from said first digital to analog converter for a first time period comprises routing said output from said first digital to analog converter through a first circuit path having a first time constant;

said step of generating a control voltage signal based on output from said second digital to analog converter comprises routing said output from said second digital to analog converter through a second circuit path having a second time constant; and said second time constant is larger than said first time constant.

7. The method of claim 6 wherein said second time constant is at least ten times larger than said first time constant.

8. A method of generating a control voltage from a logic circuit having a first digital to analog converter having L bit control and a second digital to analog converter having N bit control, wherein L is less than N, said method comprising:

sleeping said first digital to analog converter and said second digital to analog converter;

thereafter, awakening said first digital to analog converter and supplying an input voltage reference signal having a first state and L control bits to said first digital to analog converter;

producing an output from said first digital to analog converter based on said first state of said voltage reference signal and said L control bits for a first time period;

awakening said second digital to analog converter;

after said first time period expires, changing the state of said input voltage reference signal to a second state; and supplying said input voltage reference signal having said second state and N control bits to said second digital to analog converter and producing an output from said second digital to analog converter based on said second state of said voltage reference signal and said N control bits;

deriving a control voltage based at least on said output from said first digital to analog converter during said first time period and based on at least said output from said second digital to analog converter during a second time period after said first time period.

9. The method of claim 8 wherein said step of deriving a control voltage based at least on said output from said first digital to analog converter during said first time period and based on at least said output from said second digital to analog converter during a second time period after said first time period comprises:

routing said output from said first digital to analog converter to a filter having a capacitor to charge said capacitor;

routing said output from said second digital to analog converter to said filter to charge said capacitor;

wherein said output from said first digital to analog converter accelerates the charging of said capacitor with respect to the output of said second digital to analog converter.

10. The method of claim 9 wherein said wherein said output from said first digital to analog converter accelerates the charging of said capacitor with respect to the output of said second digital to analog converter by a factor of ten.

11. The method of claim 8 wherein said first digital to analog converter is designed to supply a first amount of current during said first time period and wherein said second digital to analog converter is designed to supply a second amount of current during said second time period, and wherein said first amount of current is at least five times more than said second amount of current.

12. The method of claim 8 wherein:

said step of deriving said control voltage based at least on said output from said first digital to analog converter during said first time period and based on at least said output from said second digital to analog converter during a second time period after said first time period comprises routing said output from said first digital to analog converter through a first circuit path having a first time constant during said first time period and routing said output from said second digital to analog converter through a second circuit path having a second time constant after said first time period; and said second time constant is larger than said first time constant.

13. The method of claim 12 wherein said second time constant is at least ten times larger than said first time constant.

14. A method of generating a control voltage signal using the outputs of first and second digital to analog converters, the output of said first digital to analog converter varying based on L control bits and a reference voltage supplied to said first digital to analog converter, said method comprising the steps of:

generating a control voltage signal by selectively adjusting said reference voltage to emulate greater than L-bit control of the output of said first digital to analog converter for a predetermined time period; and thereafter, continuing to generate said control voltage signal based on the output of said second digital to analog converter but not said first digital to analog converter.

15. The method of claim 14 wherein the output of said second digital to analog converter varies based on N control bits, wherein L is less than N.

16. The method of claim 14 wherein said step of generating said control voltage by selectively adjusting said reference voltage to emulate greater than L-bit control of the output of said first digital to analog converter for a predetermined time period comprises routing said output of said digital to analog converter to a filter including a capacitor to charge said capacitor.

17. The method of claim 16 wherein said step of continuing to generate said control voltage based on the output of said second digital to analog converter comprises continuing to generate said control voltage based on the output of said second digital to analog converter for a second time period, wherein said second time period is more than ten times said first time period.

18. The method of claim 17 wherein said first digital to analog converter is designed to supply a first amount of current during said first time period and wherein said second digital to analog converter is designed to supply a second amount of current during said second time period, and wherein said first amount of current is at least five times more than said second amount of current.

19. A control voltage generating circuit, comprising:

a first digital to analog converter with L bit control;

a second digital to analog converter with N bit control connected in parallel with said first digital to analog converter; wherein L is less than N;

a filter connected to said first digital to analog converter and said second digital to analog converter; said filter including a capacitor and having an output;

a voltage reference signal supplied to both said first digital to analog converter and said second digital to analog converter, said voltage reference signal having at least a first state and a second state;

said filter output varying sequentially between at least the following three modes:
i) a first mode wherein said filter output is based on said first digital to analog converter and said voltage reference signal having said first state;
ii) a second mode wherein said filter output is based on said second digital to analog converter and said voltage reference signal having said second state;
iii) a sleep mode wherein said filter output is substantially zero, said capacitor charging faster in said first mode than in said second mode.

20. The circuit of claim 19 further including a selectively enabled reference voltage adjustment circuit operative to change said voltage reference signal between said first state and said second state.

21. The circuit of claim 20 wherein said reference voltage adjustment circuit includes an open drain transistor.

22. The circuit of claim 21 wherein said filter further comprises a first circuit path comprising said capacitor and a first resistor electrically disposed between said first digital to analog converter and said capacitor, and wherein said filter further comprises a second circuit path comprising said capacitor and a second resistor electrically disposed between said second digital to analog converter and said capacitor, said first circuit path having a first time constant associated therewith, said second circuit path having a second time constant associated therewith, wherein said second time constant is at least five times larger than said first time constant.

* * * * *